(12) United States Patent
Kawai et al.

(10) Patent No.: US 6,919,707 B2
(45) Date of Patent: Jul. 19, 2005

(54) BATTERY POWER SOURCE DEVICE, METHOD FOR CONTROLLING THE SAME, AND METHOD FOR PROVIDING ADDRESS

(75) Inventors: Hirokazu Kawai, Matsusaka (JP); Masahiro Kadono, Toyohashi (JP)

(73) Assignee: Panasonic EV Energy Co., Ltd., Shizuoka (JP)

(*) Notice: Subject to any disclaimer, the term of this patent is extended or adjusted under 35 U.S.C. 154(b) by 0 days.

(21) Appl. No.: 10/331,323

(22) Filed: Dec. 31, 2002

(65) Prior Publication Data

US 2003/0129457 A1 Jul. 10, 2003

(30) Foreign Application Priority Data

Jan. 10, 2002 (JP) ........................................ 2002-003141

(51) Int. Cl.[7] ................................................ H02J 7/00
(52) U.S. Cl. ...................................... 320/117; 320/116
(58) Field of Search ................................ 320/117, 116, 320/119, 120, 125, 126, 128, 132, 134, 135; 429/61, 90–92, 96–100; 307/61, 66, 65, 46, 48, 71; 324/431, 433, 426, 527, 434; 709/223, 224, 225; 701/114, 115, 110; 712/31, 32, 34, 43; 370/311, 312, 313; 710/131, 110, 126; 711/206, 207, 208, 220

(56) References Cited

U.S. PATENT DOCUMENTS

| | | | |
|---|---|---|---|
| 5,422,558 A | 6/1995 | Stewart | 320/120 |
| 5,914,585 A | 6/1999 | Grabon | 320/125 |
| 5,923,148 A * | 7/1999 | Sideris et al. | 320/116 |
| 6,072,300 A * | 6/2000 | Tsuji | 320/116 |
| 6,252,376 B1 | 6/2001 | Nakamura et al. | 320/132 |
| 6,274,950 B1 | 8/2001 | Gottlieb et al. | 307/66 |
| 6,417,647 B2 * | 7/2002 | Kaji et al. | 320/132 |

FOREIGN PATENT DOCUMENTS

| | | | |
|---|---|---|---|
| EP | 0798839 | 10/1997 | |
| EP | 1380739 | 5/2003 | |
| EP | 1317045 | 6/2003 | |
| GB | 2341258 | 3/2000 | |
| JP | 06175888 A * | 6/1994 | G06F/11/30 |
| JP | 2000-133318 | 5/2000 | |
| JP | 2001-309563 | 11/2001 | |
| WO | WO 9810478 A1 * | 3/1998 | H01M/10/42 |

OTHER PUBLICATIONS

English Language Abstract of JP 2001–309563.
English Language Abstract of JP 2000–133318.

* cited by examiner

*Primary Examiner*—Donald Sparks
*Assistant Examiner*—Lawrence Luk
(74) *Attorney, Agent, or Firm*—Greenblum & Bernstein, P.L.C.

(57) ABSTRACT

A method for controlling and addressing a battery power source device having a plurality of battery pack systems connected in parallel or serially in parallel, each battery pack system having a battery pack block and a battery ECU connected thereto, is provided. The battery ECUs are connected to each other over communication lines, and a plurality of address setting terminals and address lines are connected to each other differently to provide a unique address to each battery ECU. When an abnormal state is detected in one of the battery pack blocks over the communication line, control is provided to the abnormal one of the battery pack blocks, identified by its address, to turn off its open/close relay contact to disconnect it from the parallel or the serial parallel connection, thereby preventing the function of the entire battery power source device from being stopped or degraded.

10 Claims, 2 Drawing Sheets

BATTERY POWER SOURCE DEVICE, METHOD FOR CONTROLLING THE SAME, AND METHOD FOR PROVIDING ADDRESS

The present disclosure relates to subject matter contained in priority Japanese Patent Application No. 2002-3141, filed on Jan. 10, 2002, the contents of which is herein expressly incorporated by reference in its entirety.

BACKGROUND OF THE INVENTION

1. Field of the Invention

The present invention relates to a battery power source device for supplying high drive power required for large hybrid vehicles, a method for controlling the power source device, and a method for assigning an address.

2. Description of Related Art

A battery power source device employed as a power source for hybrid vehicles includes a battery pack block having a plurality of battery modules (e.g., 30 battery modules) connected in series, each battery module having a plurality of rechargeable batteries (e.g., 6 batteries) connected in series. To provide control to the operating conditions of the battery pack block, the battery power source device further includes a battery ECU (Electronic Control Unit) for sensing the voltage, current, and temperature of the battery pack block to detect abnormal states thereof or provide various types of control thereto based on the sensed results. Such a battery power source device is designed to supply power to the motor for driving the vehicle and to be charged by the power supplied from the generator thereof.

To supply higher power to larger vehicles, a plurality of battery pack systems each having the combination of the battery pack block and the battery ECU are designed to connect with each other serially and/or in parallel.

FIG. 2 shows the configuration of a battery power source device 30 having six battery pack blocks 1a to 1f connected serially in parallel. To control the operating condition of each of the battery pack blocks 1a to 1f, the battery pack blocks 1a to 1f are connected with battery ECUs 2a to 2f to form battery pack systems A to F, respectively, that are connected to a positive charge/discharge terminal 11 and a negative charge/discharge terminal 12.

The battery pack systems A to F are provided with respective current sensors 3a to 3f for detecting charge and discharge current, and various sensors (not shown) for detecting the voltage and temperature of each battery module, and the ambient temperature of the battery pack blocks 1a to 1f, respectively. The output from each sensor is delivered to their respective battery ECUs 2a to 2f. The battery ECUs 2a to 2f monitor the operating condition of the respective battery pack blocks 1a to 1f to check for any abnormal state based on the delivered voltage, current, and temperature as well as to provide control to a cooling device, such as an air blower, provided in each of the battery pack blocks 1a to 1f based on the detected temperatures. The battery ECUs 2a to 2f also calculate SOC (State of Charge or the quantity of electric charge accumulated relative to the battery capacity) from the delivered voltage, current, and temperature. The SOC and detected values such as voltage are delivered to external devices as the data on the operating condition of the battery pack blocks 1a to 1f, and for the hybrid vehicle, to a vehicle control ECU for controlling charge and discharge operations on the battery power source device 30.

With the battery power source device 30 including a plurality of battery pack systems A to F, there is a problem that any failure of one battery pack block have detrimental effects on the entire battery power source device, resulting in a decreased power supply to the vehicle. For example, suppose that a short circuit has occurred in a rechargeable battery that constitutes the battery pack block 1c of the battery pack system C. This causes a drop in the output voltage of the battery pack block 1c, which is lower than the voltage of the other battery pack blocks 1a and 1e connected in parallel thereto. Thus, a current from the other battery pack blocks 1a, 1b, 1e, and 1f flows into the battery pack block 1c, creating imbalances in capacity between the battery pack blocks and, thereby dropping the supply power delivered from the positive charge/discharge terminal 11 and the negative charge/discharge terminal 12.

On the other hand, to control the operating condition of each of the battery pack systems A to F from the vehicle side and transmit information between the battery pack systems A to F, it is necessary to identify each of the battery pack systems A to F by providing an address thereto. In general, an address number is stored in a memory to, set the address; however, this memory storing individual address numbers can result in an increase in cost and cause the battery pack systems A to F to be incompatible with other equivalent systems. There is also a possibility of installing a different type of system upon assembly or replacement.

SUMMARY OF THE INVENTION

An object of the present invention is to provide a battery power source device including a plurality of battery pack systems having the aforementioned problems solved, a method for controlling the battery power source device, and a method for providing an address in the power source device.

To achieve the aforementioned object, according to a first aspect of the present invention there is provided a method for controlling a battery power source device including a plurality of battery pack systems connected in parallel or serially in parallel to each other, each battery pack system including: a battery pack block having a plurality of rechargeable batteries connected serially with each other; and a battery ECU provided to the battery pack block, for controlling operating condition of the battery pack block. According to the method, when the battery ECU has detected an abnormal state in one of the battery pack blocks, control is provided to disconnect the battery pack block detected as to be abnormal from the parallel connection.

When the battery power source device is employed for supplying drive power to a vehicle, the load condition of a battery power source device varies all the time as the running condition of the vehicle varies. Consequently, the battery power source device has such a high power capacity as afford to meet the maximum power consumption requirement of the vehicle, and thus never causes a sudden drop in the powering performance of the vehicle due to the disconnection of the abnormal one of the battery pack blocks from the parallel or the serial parallel connection. Additionally, the vehicle requires the maximum service power only for a short period of time and the battery is able to withstand an excessive load condition for the short period of time. Accordingly, when an abnormal battery pack block is disconnected to thereby cause a drop in the maximum allowable load level, the battery is able to support a load power that exceeds the level, thereby preventing the abnormal state from having a detrimental effect on the entire battery power source device.

According to a second aspect of the invention there is provided a method for providing an address in a battery power source device including a plurality of battery pack systems connected in parallel and/or serially to each other, each battery pack system including: a battery pack block having a plurality of rechargeable batteries connected serially with each other; and a battery ECU for controlling operating condition of the battery pack block, the battery ECU being provided with a communication device for communication among the battery ECUs and with an external apparatus. According to the method, each of the battery ECUs is provided with address setting terminals being the same in number as bits corresponding to the number of the battery pack blocks, and has a different state of connection between connection lines being the same in number as the bits and the address setting terminals.

With a battery power source device configured to have a plurality of battery pack blocks, it is required that the battery ECUs each for controlling the operating condition of each of the battery pack blocks are connected to each other via a communication line, which is in turn connected to an external controller, to individually monitor the operating condition of each battery pack block. This necessitates setting an address to each battery ECU. Each battery ECU is provided with the address setting terminals the same in number as the bits corresponding to the number of the battery pack blocks. The address setting terminals are connected to the connection lines differently for each of the battery ECUs to set addresses to each of the battery pack blocks. This makes it possible to provide a common compatible specification to the battery ECUs to improve productivity and the ease of maintenance.

According to a third aspect of the invention there is provided a method for providing an address in a battery power source device including a plurality of battery pack systems connected in parallel or serially in parallel to each other, each battery pack system including: a battery pack block having a plurality of rechargeable batteries connected serially with each other, and a battery ECU for controlling operating condition of the battery pack block, the battery ECU being provided with a communication device for communication among the battery ECUs and each being provided with address setting terminals being the same in number as bits corresponding to the number of the battery pack blocks. Among the plurality of battery ECUs, one battery ECU is set to a master battery ECU by a connection between connection lines being the same in number as the bits and the address setting terminals while the other battery ECUs being set to slave battery ECUs.

The battery ECUs each provided to their respective battery pack blocks can employ one battery ECU as a master and the other battery ECUs as slaves depending on the connection between the address setting terminals and the connection lines. The communication device allows the master battery ECU to collect the information on the operating condition of each of the slave battery ECUs, and the master battery ECU provides control to the entire battery power source device.

According to a fourth aspect of the invention there is provided a battery power source device including a plurality of battery pack systems connected in parallel or serially in parallel to each other, each battery pack system including: a battery pack block having a plurality of rechargeable batteries connected serially with each other; and a battery ECU for controlling operating condition of the battery pack block. In the battery power source device, the battery ECUs each are provided with a communication device for communication among the battery ECUs and each are provided with address setting terminals being the same in number as bits corresponding to the number of the battery pack blocks. Further, among the plurality of battery ECUs one battery ECU is set to a master battery ECU by a connection between connection lines being the same in number as the bits and the address setting terminals while the other battery ECUs are set to slave battery ECUs.

The battery ECUs each provided in their respective battery pack blocks can employ one battery ECU as a master and the other battery ECUs as slaves depending on the connection between the address setting terminals and the connection lines. The communication device allows the master battery ECU to collect the information on the operating condition of each of the slave battery ECUs, and the master battery ECU provides control to the entire battery power source device. The master battery ECU collects the information on the operating condition of each slave battery ECU and then transmits the information to outside, thereby allowing an external apparatus employing the battery power source device to monitor the operating condition of the power source device and provide control thereto.

The aforementioned arrangement can further have a function for setting, when an abnormal state is detected in the battery pack block controlled by the master battery ECU, one of the other battery pack blocks, the one being connected in parallel to the abnormal battery pack block, to serve as a master battery ECU, and for disconnecting thereafter the abnormal battery pack block from the parallel connection. When an abnormal state is detected in the battery pack block controlled by the master battery ECU, the master setting can be set to another battery ECU to thereby disconnect the abnormal battery pack block from the parallel connection. This allows the output voltage of the battery power source device to remain unchanged and the master battery ECU to provide control to the entire battery power source device, thereby never causing an abnormal state of one battery pack block to stop the operation of the battery power source device.

While novel features of the invention are set forth in the preceding, the invention, both as to organization and content, can be further understood and appreciated, along with other objects and features thereof, from the following detailed description and examples when taken in conjunction with the attached drawings.

DETAILED DESCRIPTION OF THE PREFERRED EMBODIMENTS

Figure 1:
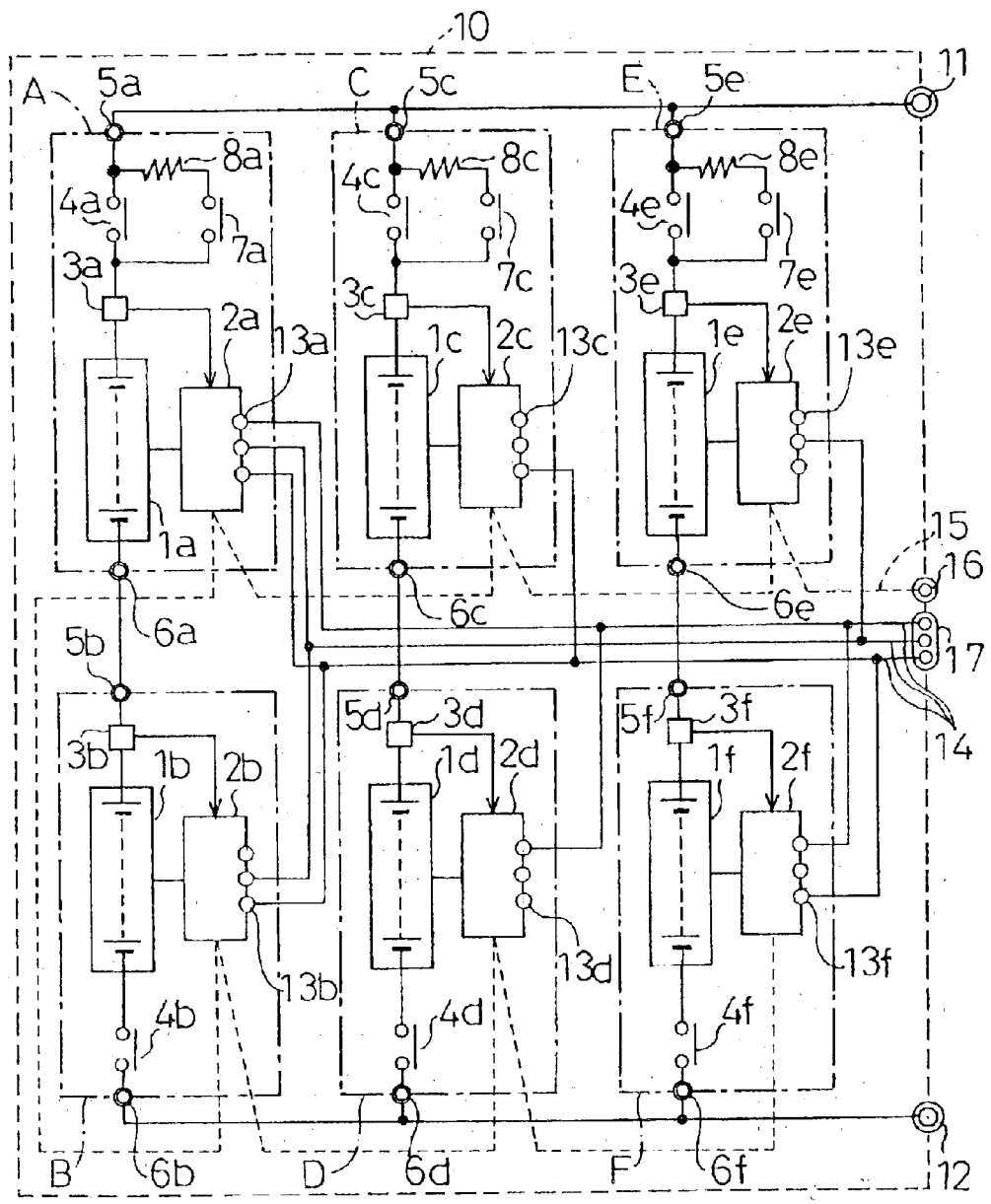
FIG. 1 is a block diagram showing a battery power source device according to an embodiment of the present invention.
Figure 2:
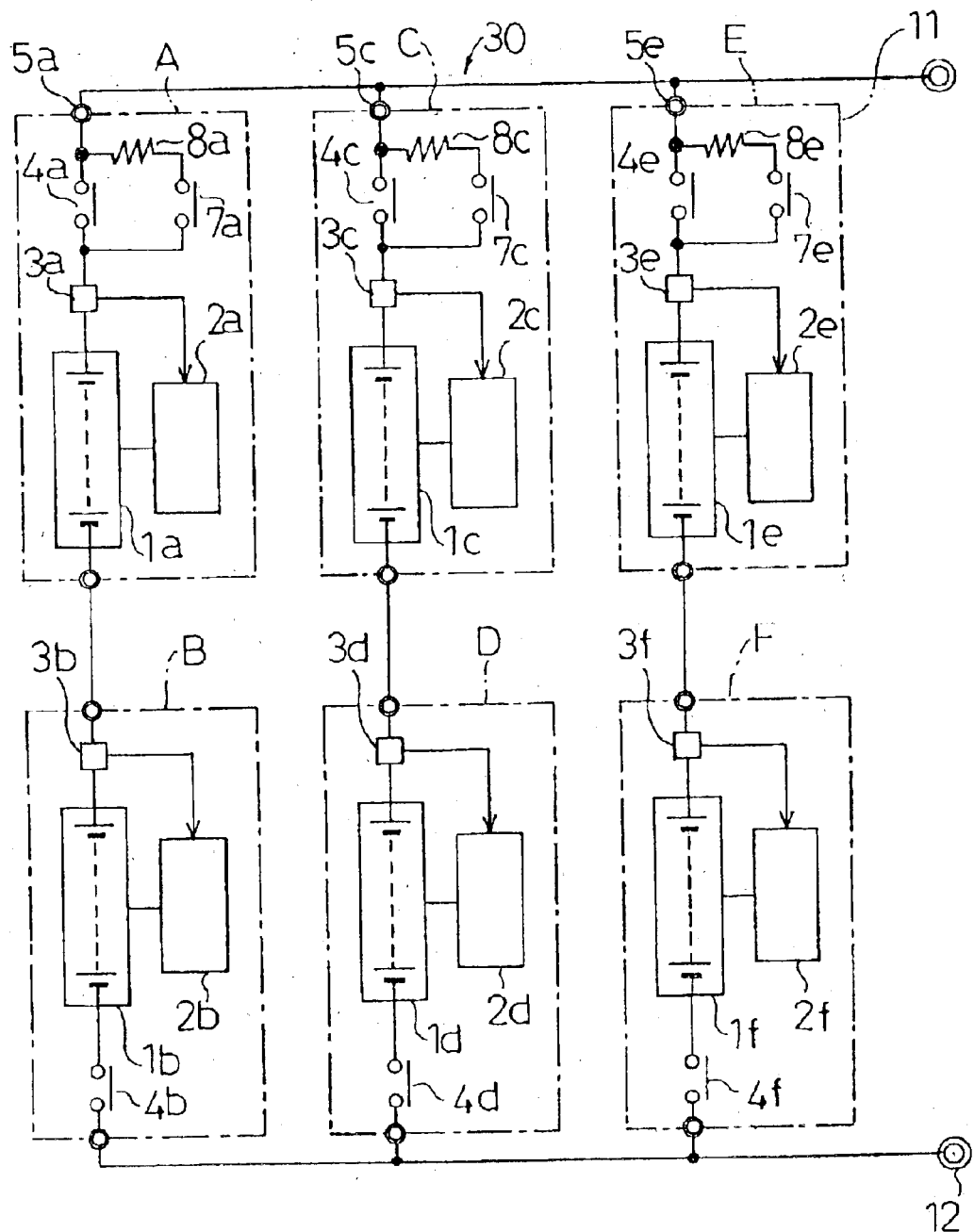
FIG. 2 is a block diagram showing a conventional battery power source device.

Now, the present invention will be described below in more detail with reference to the accompanying drawings in accordance with the embodiment to further the understanding of the invention. The embodiment described below is an example implementation of the present invention and not intended to limit the technical scope of the invention. The same components as the prior art components are indicated with the same reference numerals and symbols.

This embodiment relates to a battery power source device that is employed as a power source for driving a hybrid vehicle, especially a large hybrid vehicle, which incorporates a motor and an engine. As shown in FIG. 1, to meet a high power load demanded by the large hybrid vehicle, a battery power source device 10 according to this embodiment includes six battery pack blocks 1a to 1f in which the battery pack blocks 1a and 1b, the battery pack blocks 1c and 1d, and the battery pack blocks 1e and 1f are connected in series, respectively, and those three serially connected sets are connected in parallel so as to supply a high output voltage and output current.

The battery pack blocks 1a to 1f each include forty battery modules connected in series, each battery module having six nickel-metal hydride rechargeable batteries connected in series. The battery pack blocks 1a to 1f are further provided with sensing devices such as current sensors 3a to 3f, voltage sensors (not shown), temperature sensors (not shown), and cooling fans for cooling the batteries (not shown). The battery pack blocks 1a to 1f are connected with battery ECUs 2a to 2f to constitute the battery pack systems A to F, respectively. The battery pack systems A to F have positive terminals 5a to 5f and negative terminals 6a to 6f exposed outwardly, respectively. For this reason, the battery pack systems A to F are provided with open/close relay contacts 4a to 4f in series with the battery pack blocks 1a to 1f, respectively, to prevent an operator from receiving an electric shock when the operator contacts the terminals upon assembly or maintenance, as well as to allow the systems to be individually disconnected from the serial parallel connection. Additionally, the battery pack systems A, C, and E, serving as the positive side in the serial connection, are provided with secondary open/close contacts 7a, 7c, and 7e via resistors 8a, 8c, and 8e in parallel with the open/close contacts 4a, 4c, and 4e. To start the battery power source device 10, the secondary open/close contacts 7a, 7c, and 7e are closed prior to the open/close contacts 4a, 4c, and 4e to prevent any harmful effects exerted by an inrush current.

The battery ECUs 2a to 2f monitor the operating conditions of the battery pack blocks 1a to 1f to control the rotation of the cooling fans in accordance with the charge/discharge current and voltage of the battery pack blocks 1a to 1f, the voltage and temperature of each battery module, and the temperature (ambient temperature) of the air for cooling the battery pack blocks 1a to 1f, all of which are sensed by the current, voltage, and temperature sensors. In addition, the battery ECUs 2a to 2f compute the SOC (State of Charge) or the quantity of charge accumulated relative to the battery capacity based on the voltage, current, and temperature values sensed, requiring a vehicle control ECU or a vehicle controller to provide such a charge and discharge state enough to maintain the SOC at a proper state. When an abnormal state is detected based on the sensed voltage, current, and temperature, and the computed SOC, an abnormality indication signal is delivered to the vehicle control ECU.

As described above, the battery ECUs 2a to 2f provide control to the operating condition of the plurality of battery pack blocks 1a to 1f, respectively. At the same time, the control data on each of the battery ECUs 2a to 2f is transmitted to the vehicle control ECU, which transmits control data to each of the battery ECUs 2a to 2f in response to the running condition. Each of the battery ECUs 2a to 2f is provided with a network interface so that data is exchanged among the battery ECUs 2a to 2f and between the battery ECUs 2a to 2f and the vehicle control ECU. The battery ECUs 2a to 2f are connected to each other over a communication line 15 to form a battery network. This battery network is connected via a communication terminal 16 to a vehicle network provided in the vehicle and to the vehicle control ECU through the vehicle network.

As described above, a communication network is formed among the battery ECUs 2a to 2f and between the vehicle and the battery ECUs. In this case, the battery ECUs 2a to 2f each need to have an address set thereto to be identified, and thus provided with address setting terminals 13a to 13f. The address setting terminals 13a to 13f are designed such that the connection among three terminals and three address lines 14 can be changed for each of the battery ECUs 2a to 2f to set their respective addresses, thereby providing different addresses even to the battery pack systems A to F having the same specification.

The number of the address setting terminals 13a to 13f are the same as the number of bits corresponding to the number of the battery pack systems A to F. In this embodiment, since the number of the battery pack systems is six and thus the minimum number of bits to identify the systems is three, the three address setting terminals 13a to 13f and the three address lines 14 are connected differently to each other to provide a different address to each of the battery ECUs 2a to 2f, thereby setting their respective addresses. That is, three bits are used to set addresses, "1" for the terminal connected to the address lines 14 and "0" for the terminal not connected thereto, of the three address setting terminals 13a to 13f of the battery ECUs 2a to 2f. The three address lines 14 are connected to the vehicle at address terminals 17.

Suppose that an abnormal state has been found in one of the six battery pack blocks 1a to 1f in the aforementioned battery power source device 10. In this case, since the abnormal state is sensed with the battery ECUs 2a to 2f, the vehicle is informed of the occurrence of the abnormal state over the communication line 15 via the communication terminal 16, and the aforementioned address setting structure allows identifying the battery pack block in which the abnormal state has occurred among the battery pack blocks 1a to 1f. The vehicle control ECU that has been informed of the occurrence of the abnormal state sends a control command to the one of the battery ECUs 2a to 2f that corresponds to the address. This causes the corresponding one of the battery ECUs 2a to 2f to open the one of the open/close relay contacts 4a to 4f, thereby disconnecting the abnormal one of the battery pack blocks 1a to 1f from the serial parallel connection.

Since the running condition of the vehicle varies, the load condition of the battery power source device 10 also varies all the time. Consequently, the battery power source device 10 has such high a power capacity as can afford to meet the maximum power consumption requirement of the vehicle, and thus never causes a sudden drop in the powering performance of the vehicle due to the disconnection of the abnormal one of the battery pack blocks 1a to 1f. Additionally, the battery can withstand an excessive load condition for a short period of time and the vehicle is subjected to a high load condition for the short period of time. Accordingly, when one of the battery pack blocks 1a to 1f is disconnected to cause a drop in the maximum allowable load level, the battery can support a load power that exceeds the level. On the other hand, when the vehicle control ECU is informed of the occurrence of the abnormal state, the vehicle control ECU can lower the maximum allowable load level of the battery power source device 10 and provide control to the hybrid vehicle that employs a motor and an engine in combination so as to compensate for the drop in the battery power by the engine.

Now, consider a case where a plurality of battery pack blocks 1a to 1f are used to form the battery power source device 10. In this case, data is not exchanged between each of the battery ECUs 2a to 2f and the vehicle control ECU.

A particular battery ECU or the battery ECU 2a in the present embodiment is employed as a master and the other battery ECUs 2b to 2f are employed as a slave in the configuration according to this embodiment so that data is exchanged between the master battery ECU 2a and the vehicle control ECU. With this arrangement, the master battery ECU 2a collects various pieces of information on the operating condition of each of the slave battery ECUs 2b to 2f to transmit the information on itself and the ECUs to the vehicle control ECU.

When an abnormal state has been detected in the battery pack blocks 1a to 1f controlled by the battery ECUs 2a to 2f, control is provided so as to disconnect the abnormal battery pack block from the parallel connection as described above. When an abnormal state occurs in the battery pack block 1a controlled by the master battery ECU 2a, the master setting is changed to any one of the other battery ECUs 2c, 2d, 2e, and 2f that is connected in parallel thereto. Thereafter, control is provided so as to disconnect the abnormal battery pack blocks 1a and 1b from the parallel connection. This control maintains the master setting even when an abnormal state occurs in the battery pack block 1a controlled by the master battery ECU 2a, thereby never causing the battery power source device 10 to fail due to the abnormal state of one battery pack block.

On the other hand, as a matter of course, the information on the control for disconnection and the information on the change of the master setting is transmitted to the vehicle control ECU, and can be transmitted by the master battery ECU 2a of the abnormal battery pack block 1a upon detection of the abnormal state or by a substitute master battery ECU.

In the embodiment described above, an example has been shown in accordance with a hybrid vehicle; however, the present invention is not limited thereto. The invention is also applicable to uninterruptible power supply systems for backing up the power source of large apparatus or to automatically guided vehicles employed in production lines.

An abnormal one of the battery pack blocks 1a to 1f is disconnected from the connection and then replaced with a good one, thereby recovering the normal state of the battery power source device 10.

As described above, according to the present invention, with a battery power source device including a plurality of battery pack blocks connected in parallel or serially in parallel, control is provided so as to disconnect an abnormal battery pack block from the parallel or the serial parallel connection, thereby preventing the function of the entire battery power source device from being degraded or stopped due to the one abnormal battery pack block.

Furthermore, in a battery power source device configured to have a plurality of battery pack blocks connected in parallel and/or serially, each of the battery pack blocks is provided with a battery ECU for controlling the operating condition thereof, and an address is set to each battery ECU. A plurality of address setting terminals are connected differently to set addresses, thereby providing a common compatible specification to the battery ECUs to improve productivity and the ease of maintenance.

Furthermore, one of the plurality of battery ECUs is employed as a master and the other battery ECUs are employed as a slave. This allows the master battery ECU to collect information on the operating condition of each battery pack block to provide collective control to the battery power source device, thereby facilitating the exchange of information with an apparatus that employs the battery power source device.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A method of controlling a battery power source device having a plurality of battery pack systems, the method comprising:
   providing each of the battery pack systems connected in at least one of parallel and series with a battery pack block having a plurality of rechargeable batteries connected in series with each other, and a battery electronic control unit (ECU) that controls an operating condition of the battery pack block;
   detecting an abnormal state in one of the battery pack blocks with the battery ECU; and
   disconnecting, with the battery ECU, the battery pack block detected as having the abnormal state from the other battery pack blocks.

2. The method according to claim 1, wherein disconnecting further comprises one of opening or closing a relay of the abnormal battery pack block.

3. The method according to claim 2, wherein the battery pack systems further comprise secondary relays.

4. A method of providing an address for a battery power source device, the method comprising:
   providing the battery power source device with a plurality of battery pack systems connected in at least one of parallel and series to each other, each battery pack system including a battery pack block having a plurality of rechargeable batteries connected in series with each other, and a battery electronic control unit (ECU) for each of the battery pack blocks that controls an operating condition of the battery pack block, the battery ECU having a communication device that communicates with the other battery ECUs and with an external apparatus;
   providing each of the battery ECUs with address setting terminals and connection lines, the number of setting terminals and connection lines being the same as a number of bits sufficient to identify a number of the battery pack blocks; and
   connecting each of the battery ECUs with different combinations of the connection lines and the address setting terminals.

5. A method of providing an address in a battery power source device, the method comprising:
   providing the battery power source device with a plurality of battery pack systems connected in at least one of parallel and series to each other, each battery pack system including a battery pack block having a plurality of rechargeable batteries connected in series with each other, and a battery electronic control unit (ECU) that controls an operating condition of the battery pack block, said battery ECU being provided with a communication device that communicates among said battery ECUs and including address setting terminals and connection lines, the number of setting terminals and connection lines being the same as a number of bits corresponding to a number of the battery pack blocks;
   setting one of the plurality of battery ECUs to be a master battery ECU by a connection between the connection lines and the address setting terminals; and
   setting the remaining battery ECUs to be slave battery ECUs.

6. A battery power source device comprising:

a plurality of battery pack systems connected in at least one of parallel and series to each other, each battery pack system including a battery pack block having a plurality of rechargeable batteries connected in series with each other;

a battery electronic control unit (ECU) for each of the plurality of battery pack blocks that controls an operating condition of the battery pack block; and a plurality of communicators for each of said battery ECUs that communicate with said battery ECUs, each ECU including address setting terminals and connection lines, the number of setting terminals and connections lines being the same as a number of bits corresponding to a number of the battery pack blocks, wherein one of the battery ECUs is set as a master battery ECU by a connection between the connection lines and said address setting terminals while the remaining battery ECUs are set to be slave battery ECUs.

7. The battery power source device according to claim 6, wherein said master battery ECU collects information on an operating condition of each slave battery ECU and communicates the information externally.

8. The battery power source device according to claim 6, further comprising:

a setter that sets, when an abnormal state is detected in the battery pack block controlled by said master battery ECU, one of the other battery ECUs, connected in parallel to said abnormal battery pack block, to serve as a master battery ECU, and that thereafter disconnects the abnormal battery pack block from the other battery pack blocks.

9. The battery power source device according to claim 8, wherein disconnecting further comprises one of opening or closing a relay of the abnormal battery pack block.

10. The battery power source device according to claim 9, wherein the battery pack systems further comprise secondary relays.

* * * * *